(12) United States Patent
Mullur et al.

(10) Patent No.: US 9,195,783 B2
(45) Date of Patent: Nov. 24, 2015

(54) REDUCING THE DIMENSIONALITY OF THE JOINT INVERSION PROBLEM

(75) Inventors: Anoop A. Mullur, Houston, TX (US); Dennis E. Willen, Houston, TX (US); Rebecca L. Saltzer, Houston, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 412 days.

(21) Appl. No.: 13/814,214

(22) PCT Filed: Jun. 27, 2011

(86) PCT No.: PCT/US2011/042026
§ 371 (c)(1),
(2), (4) Date: Feb. 4, 2013

(87) PCT Pub. No.: WO2012/024025
PCT Pub. Date: Feb. 23, 2012

(65) Prior Publication Data
US 2013/0179137 A1 Jul. 11, 2013

Related U.S. Application Data

(60) Provisional application No. 61/374,135, filed on Aug. 16, 2010.

(51) Int. Cl.
*G06G 7/48* (2006.01)
*G06F 17/50* (2006.01)
(Continued)

(52) U.S. Cl.
CPC .............. *G06F 17/5009* (2013.01); *G01V 3/12* (2013.01); *G01V 3/18* (2013.01); *G01V 11/00* (2013.01); *G01V 2210/6163* (2013.01); *G01V 2210/6165* (2013.01)

(58) Field of Classification Search
CPC ......... G06F 17/10; G06F 17/14; G06F 19/00; G06G 7/48; G01V 3/18; G01V 1/28; G01V 3/12; G01V 3/38; E21B 43/00
See application file for complete search history.

(56) References Cited

U.S. PATENT DOCUMENTS

| 4,742,305 A | 5/1988 | Stolarczyk |
|---|---|---|
| 4,792,761 A | 12/1988 | King et al. |

(Continued)

FOREIGN PATENT DOCUMENTS

| EP | 2 020 609 | 11/2012 |
|---|---|---|
| GB | 2 402 745 | 8/2005 |

(Continued)

OTHER PUBLICATIONS

Bleistein, N. (1987) "On the imaging of reflectors in the earth", *Geophysics* 52(7), pp. 931-942.

(Continued)

*Primary Examiner* — Kandasamy Thangavelu
(74) *Attorney, Agent, or Firm* — ExxonMobil Upstream Research Company, Law Dept.

(57) ABSTRACT

Method for reducing a 3D joint inversion of at least two different types of geophysical data acquired by 3-D surveys to an equivalent set of 1D inversions. First, a 3D inversion is performed on each data type separately to the yield a 3-D model of a physical property corresponding to the data type. Next, a 1D model of the physical property is extracted at selected (x,y) locations. A 1D simulator and the 1D model of the physical property is then used at each of the selected locations to create a synthetic 1D data set at each location. Finally, the 1D synthetic data sets for each different type of geophysical data are jointly inverted at each of the selected locations, yielding improved values of the physical properties. Because the joint inversion is a 1D inversion, the method is computationally advantageous, while recognizing the impact of 3-D effects.

8 Claims, 3 Drawing Sheets

(51) Int. Cl.
  *G01V 3/18* (2006.01)
  *G01V 3/12* (2006.01)
  *G01V 11/00* (2006.01)

(56) References Cited

U.S. PATENT DOCUMENTS

| | | | |
|---|---|---|---|
| 4,831,383 A | 5/1989 | Ohnishi et al. |
| 4,875,015 A | 10/1989 | Ward |
| 5,050,129 A | 9/1991 | Schultz |
| 5,175,500 A | 12/1992 | McNeill |
| 5,189,644 A | 2/1993 | Wood |
| 5,210,691 A | 5/1993 | Freedman et al. |
| 5,265,192 A | 11/1993 | McCormack |
| 5,357,893 A | 10/1994 | Ruffa |
| 5,373,443 A | 12/1994 | Lee et al. |
| 5,406,206 A | 4/1995 | Safinya et al. |
| 5,467,018 A | 11/1995 | Ruter et al. |
| 5,563,513 A | 10/1996 | Tasci et al. |
| 5,594,343 A | 1/1997 | Clark et al. |
| 5,706,194 A | 1/1998 | Neff et al. |
| 5,764,515 A | 6/1998 | Guerillot et al. |
| 5,770,945 A | 6/1998 | Constable |
| 5,825,188 A | 10/1998 | Montgomery et al. |
| 5,835,883 A | 11/1998 | Neff et al. |
| 5,841,733 A | 11/1998 | Bouyoucos et al. |
| 5,870,690 A * | 2/1999 | Frenkel ............... G01V 1/48 702/7 |
| 5,884,227 A | 3/1999 | Rabinovich et al. |
| 5,905,657 A | 5/1999 | Celniker |
| 6,037,776 A | 3/2000 | McGlone |
| 6,049,760 A | 4/2000 | Scott |
| 6,088,656 A | 7/2000 | Ramakrishnan et al. |
| 6,094,400 A | 7/2000 | Ikelle |
| 6,101,448 A | 8/2000 | Ikelle et al. |
| 6,115,670 A | 9/2000 | Druskin et al. |
| 6,138,075 A | 10/2000 | Yost |
| 6,181,138 B1 | 1/2001 | Hagiwara et al. |
| 6,253,100 B1 | 6/2001 | Zhdanov |
| 6,253,627 B1 | 7/2001 | Lee et al. |
| 6,256,587 B1 | 7/2001 | Jericevic et al. |
| 6,278,948 B1 | 8/2001 | Jorgensen et al. |
| 6,304,086 B1 | 10/2001 | Minerbo et al. |
| 6,311,132 B1 | 10/2001 | Rosenquist et al. |
| 6,332,109 B1 | 12/2001 | Sheard et al. |
| 6,339,333 B1 | 1/2002 | Kuo |
| 6,393,363 B1 | 5/2002 | Wilt et al. |
| 6,424,918 B1 | 7/2002 | Jorgenen et al. |
| 6,430,507 B1 | 8/2002 | Jorgensen et al. |
| 6,466,021 B1 | 10/2002 | MacEnany |
| 6,470,274 B1 | 10/2002 | Mollison et al. |
| 6,476,609 B1 | 11/2002 | Bittar |
| 6,493,632 B1 | 12/2002 | Mollison et al. |
| 6,502,037 B1 * | 12/2002 | Jorgensen et al. ............... 702/14 |
| 6,529,833 B2 | 3/2003 | Fanini et al. |
| 6,533,627 B1 | 3/2003 | Ambs |
| 6,534,986 B2 | 3/2003 | Nichols |
| 6,593,746 B2 | 7/2003 | Stolarczyk |
| 6,594,584 B1 | 7/2003 | Omeragic et al. |
| 6,671,623 B1 | 12/2003 | Li |
| 6,675,097 B2 | 1/2004 | Routh et al. |
| 6,686,736 B2 | 2/2004 | Schoen et al. |
| 6,711,502 B2 | 3/2004 | Mollison et al. |
| 6,724,192 B1 | 4/2004 | McGlone |
| 6,739,165 B1 | 5/2004 | Strack |
| 6,765,383 B1 | 7/2004 | Barringer |
| 6,813,566 B2 | 11/2004 | Hartley |
| 6,816,787 B2 | 11/2004 | Ramamoorthy et al. |
| 6,842,006 B2 | 1/2005 | Conti et al. |
| 6,842,400 B2 | 1/2005 | Blanch et al. |
| 6,846,133 B2 | 1/2005 | Martin et al. |
| 6,876,725 B2 | 4/2005 | Rashid-Farrokhi et al. |
| 6,883,452 B1 | 4/2005 | Gieseke |
| 6,888,623 B2 | 5/2005 | Clements |
| 6,901,029 B2 | 5/2005 | Raillon et al. |
| 6,901,333 B2 | 5/2005 | Van Riel et al. |
| 6,914,433 B2 | 7/2005 | Wright et al. |
| 6,950,747 B2 | 9/2005 | Byerly |
| 6,957,708 B2 | 10/2005 | Chemali et al. |
| 6,958,610 B2 | 10/2005 | Gianzero |
| 6,977,866 B2 | 12/2005 | Huffman et al. |
| 6,985,403 B2 | 1/2006 | Nicholson |
| 6,993,433 B2 | 1/2006 | Chavarria et al. |
| 6,999,880 B2 | 2/2006 | Lee |
| 7,002,349 B2 | 2/2006 | Barringer |
| 7,002,350 B1 | 2/2006 | Barringer |
| 7,023,213 B2 | 4/2006 | Nichols |
| 7,039,525 B2 | 5/2006 | Mittet |
| 7,062,072 B2 | 6/2006 | Anxionnaz et al. |
| 7,092,315 B2 | 8/2006 | Olivier |
| 7,109,717 B2 | 9/2006 | Constable |
| 7,113,869 B2 | 9/2006 | Xue |
| 7,114,565 B2 | 10/2006 | Estes et al. |
| 7,116,108 B2 | 10/2006 | Constable |
| 7,126,338 B2 | 10/2006 | MacGregor et al. |
| 7,142,986 B2 | 11/2006 | Moran |
| 7,187,569 B2 | 3/2007 | Sinha et al. |
| 7,191,063 B2 | 3/2007 | Tompkins |
| 7,203,599 B1 | 4/2007 | Strack et al. |
| 7,227,363 B2 | 6/2007 | Gianzero et al. |
| 7,250,768 B2 | 7/2007 | Ritter et al. |
| 7,257,049 B1 | 8/2007 | Laws et al. |
| 7,262,399 B2 | 8/2007 | Hayashi et al. |
| 7,262,602 B2 | 8/2007 | Meyer |
| 7,307,424 B2 | 12/2007 | MacGregor et al. |
| 7,328,107 B2 | 2/2008 | Strack et al. |
| 7,337,064 B2 | 2/2008 | MacGregor et al. |
| 7,347,271 B2 | 3/2008 | Ohmer et al. |
| 7,356,412 B2 | 4/2008 | Tompkins |
| 7,362,102 B2 | 4/2008 | Andreis |
| 7,382,135 B2 | 6/2008 | Li et al. |
| 7,400,977 B2 | 7/2008 | Alumbaugh et al. |
| 7,411,399 B2 | 8/2008 | Reddig et al. |
| 7,453,763 B2 | 11/2008 | Johnstad |
| 7,456,632 B2 | 11/2008 | Johnstad et al. |
| 7,477,160 B2 | 1/2009 | Lemenager et al. |
| 7,482,813 B2 | 1/2009 | Constable et al. |
| 7,502,690 B2 | 3/2009 | Thomsen et al. |
| 7,504,829 B2 | 3/2009 | Watts |
| 7,536,262 B2 | 5/2009 | Hornbostel et al. |
| 7,542,851 B2 | 6/2009 | Tompkins |
| 7,636,275 B2 | 12/2009 | Anno et al. |
| 7,659,721 B2 | 2/2010 | MacGregor et al. |
| 7,660,188 B2 | 2/2010 | Meldahl |
| 7,683,625 B2 | 3/2010 | Milne et al. |
| 7,822,552 B2 | 10/2010 | Bittleston |
| 7,840,394 B2 | 11/2010 | Madatov et al. |
| 7,884,612 B2 | 2/2011 | Conti et al. |
| 7,928,732 B2 | 4/2011 | Nichols |
| 8,008,920 B2 | 8/2011 | Lu et al. |
| 8,098,543 B2 | 1/2012 | Bachrach et al. |
| 8,099,239 B2 | 1/2012 | MacGregor et al. |
| 2002/0172329 A1 | 11/2002 | Rashid-Farrokhi et al. |
| 2004/0122634 A1 * | 6/2004 | Calvert et al. ............... 703/2 |
| 2005/0128874 A1 | 6/2005 | Herkenhoff et al. |
| 2005/0237063 A1 | 10/2005 | Wright et al. |
| 2006/0095239 A1 | 5/2006 | Frenkel |
| 2006/0186887 A1 | 8/2006 | Strack et al. |
| 2007/0280047 A1 | 12/2007 | MacGregor et al. |
| 2007/0288211 A1 | 12/2007 | MacGregor et al. |
| 2008/0007265 A1 | 1/2008 | Milne et al. |
| 2008/0008920 A1 | 1/2008 | Alexandrovichserov et al. |
| 2008/0105425 A1 | 5/2008 | MacGregor et al. |
| 2008/0106265 A1 | 5/2008 | Campbell |
| 2008/0265896 A1 * | 10/2008 | Strack ............... G01V 3/12 324/350 |
| 2009/0005997 A1 | 1/2009 | Willen |
| 2009/0119076 A1 | 5/2009 | Madatov et al. |
| 2009/0187391 A1 | 7/2009 | Wendt et al. |
| 2009/0204327 A1 * | 8/2009 | Lu et al. ............... 702/7 |
| 2009/0204330 A1 | 8/2009 | Thomsen et al. |
| 2009/0243613 A1 | 10/2009 | Lu et al. |
| 2009/0265111 A1 * | 10/2009 | Helwig ............... G01V 3/12 702/7 |
| 2009/0303834 A1 | 12/2009 | Sengupta et al. |

(56) References Cited

U.S. PATENT DOCUMENTS

| | | |
|---|---|---|
| 2009/0306900 A1 | 12/2009 | Jing et al. |
| 2009/0309599 A1 | 12/2009 | Ziolkowski |
| 2010/0004870 A1 | 1/2010 | Tonellot et al. |
| 2010/0074053 A1 | 3/2010 | Jaiswal et al. |
| 2010/0179761 A1 | 7/2010 | Burtz et al. |
| 2010/0185422 A1 | 7/2010 | Hoversten |
| 2010/0270026 A1* | 10/2010 | Lazaratos et al. ............ 166/369 |
| 2011/0000678 A1* | 1/2011 | Krebs et al. .................. 166/369 |
| 2011/0255371 A1* | 10/2011 | Jing et al. ........................ 367/73 |
| 2011/0301849 A1* | 12/2011 | Houck ............................... 702/7 |
| 2012/0080197 A1* | 4/2012 | Dickens et al. ............... 166/369 |

FOREIGN PATENT DOCUMENTS

| | | |
|---|---|---|
| GB | 2 410 635 | 12/2006 |
| WO | WO 98/07050 | 2/1998 |
| WO | WO 2004/109338 | 12/2004 |
| WO | WO 2006/052145 | 5/2006 |
| WO | WO 2006/073315 | 7/2006 |
| WO | WO 2008/054880 | 5/2008 |
| WO | WO 2008/062024 | 5/2008 |
| WO | WO 2008/087171 | 7/2008 |

OTHER PUBLICATIONS

Chen, J. et al. (2007), "Effects of uncertainty in rock-physics models on reservoir parameter estimation using marine seismic AVA and CSEM data", abstracts of the 77th Annual International Meeting, Society of Exploration Geophysicists, pp. 457-461.

Hoversten et al. (2006), "Direct Reservoir Parameter Estimation Using Joint Inversion", *Geophysics* 71(12), pp. C1-C13.

Hu, W. et al. (2009), "Joint Electromagentic and Seismic Inversion using Structural Constraints", *Geophysics* 74(6), pp. R99-R109.

Newman, G.A. et al. (1997), "Three-dimensional Massively Parallel Electromagnetic Inversion—I. Theory", *Geophys. J Int.* 128, pp. 345-354.

Stolt, R. H. et al. (1985), "Migration and inversion of seismic data", *Geophysics*, 50(12), pp. 2458-2472.

Xu, S. et al. (1995), A new velocity model for clay-sand mixtures, *Geophysical Processing* 43, pp. 91-118.

\* cited by examiner

REDUCING THE DIMENSIONALITY OF THE JOINT INVERSION PROBLEM

CROSS-REFERENCE TO RELATED APPLICATION

This application is the National Stage entry under 35 U.S.C. 371 of PCT/US2011/042026 that published as WO 2012/024025 and was filed on 27 Jun. 2011, which claims the benefit of U.S. Provisional Application No. 61/374,135, filed on 16 Aug. 2010, each of which is incorporated by reference, in its entirety, for all purposes.

FIELD OF THE INVENTION

This invention relates generally to the field of geophysical prospecting and, more particularly to processing of geophysical data. Specifically the invention is a method for increasing computational speed and accuracy for 3D joint inversion of two or more geophysical data types by reducing the joint inversion to a series of 1D joint inversions at selected (x, y) locations.

BACKGROUND

Inversion of geophysical data is commonly employed in the oil and gas industry as an exploration tool. Decisions regarding whether to drill exploratory wells in specific locations are often made by interpreting maps and images that have been constructed from geophysical data (e.g., seismic reflection, gravity). These data are collected over both land and marine prospects and processed with techniques specific to the type of data being measured and then sometimes inverted to produce models of the subsurface (e.g., reflectivity structure, density structure, etc.). Inversion is the process of inferring a subsurface model from data. Inversion of active seismic, controlled source electromagnetic (CSEM), and gravity data are often used—although typically independently—in the oil and gas industry.

The three components of a typical geophysical data inversion are: (i) data acquired from the field (henceforth called observed data) (ii) a forward simulator to predict data as a function of model parameters and (iii) a numerical mechanism to update model parameters in order to reduce misfit between the observed and predicted data. FIG. 1 shows the steps followed in a typical inversion process. An initial model 11 containing the best guess for the inversion parameters (such as electrical conductivity, seismic velocity, impedance, density, magnetization, etc) is provided to an inversion algorithm 12. Based on the calculated difference between observed data 17 and the data predicted (14) by a forward model 13 as a function of the model parameters, the inversion algorithm suggests an update 15 to the model parameters. This step is typically driven by a mathematical optimizer, which calculates the model update based on the sensitivity of the error function of the predicted and observed data to the model parameters. The model parameters represent a discretized version of the space of interest for inverting for physical properties and may take a variety of forms, including values at the vertices of either regular or irregular grids, values specified or interpolated between surfaces, or values to be interpolated within grids. For example, in the case of 3D CSEM inversion, the model parameters might be a 3D conductivity grid. Various model parameterizations might be used such as finite elements or boundary elements. The inversion process is typically iterative. At the end of each iteration, a termination condition is checked to decide whether to continue the iterations or stop with the then current model becoming a final model 18. This termination condition may be as simple as testing whether the model misfit 16 has dropped below a predefined value, or may involve manual intervention by observing the model updates during the iterative process. The geophysicist might manually intervene, for example, to apply alternate initial models to test hypotheses or to reconcile the inverted model with additional information.

Geophysical data inversion is a challenging process, both in terms of computational expense as well as the ill-posed nature of the problem. Despite these challenges, geophysicists in the oil and gas industry regularly use some form of inversion mechanism for data collected in the field to influence drilling decisions. However, there remains significant uncertainty in predicting the properties of the subsurface (such as structure and fluid type) through inversion of a specific type of data set. Several governing factors go into determining whether an accurate enough inversion can be performed, such as the type and quality of the observed data (measurement noise level) and the physical properties of the subsurface that are to be predicted, to name a few. Each geophysical data type may predict a different physical property, and the resolution attainable for the individual parameters may also be very different. Given these facts, the idea to jointly invert these observed data has emerged. Joint inversion involves using multiple geophysical data sets that constrain different earth properties and combining them in a way that reduces the uncertainty in predicting the earth properties.

FIG. 1 also shows the process of joint inversion, which is conceptually similar to geophysical inversion of individual data types. The difference between the two is that the numerical machinery or algorithm for joint inversion deals with multiple geophysical data simultaneously (indicated by the layering of box 17). Consequently, the geoscientist needs to use multiple forward simulators (indicated by the layering of box 13), one for each data type, possibly involving different physics and even different model representations for each data type. At each iteration of the inversion, a call to every forward simulator is made to predict each type of observed geophysical data, and a combined misfit is calculated. The inversion algorithm then suggests a model update based on this combined misfit. The update mechanism may take into account a priori information such as data uncertainty or model smoothness. How the data are combined, and over what space the inversion parameters are defined depends on the particular choice of the joint inversion implementation, but the main concept encapsulated by FIG. 1 does not change significantly. Joint inversion of several geophysical data types results in a consistent earth model that explains all the geophysical data simultaneously. Next are described briefly some of the methods of joint inversion of geophysical data that have appeared in publications. The model in FIG. 1 may be equivalently thought of as comprising all of the geophysical parameters of interest, such as conductivity, density, shear modulus, bulk modulus, or other parameters or as comprising a set of parameter models, one model for each parameter type of interest. In general, geophysical parameters may be anisotropic.

Hoversten et al., (2006) investigate an algorithm for one-dimensional joint inversion of CSEM and seismic reflection data using synthetic data instead of observed data. They implement a local optimization algorithm, which uses local sensitivity information of the data misfit to the model parameters to suggest updates to the model parameters. They state that global (derivative-free) methods are too computationally expensive for 3D problems. The distinction between local and global methods, along with their relative advantages and disadvantages is described below in this document.

Hu et al. (2009) employ what they term a cross-gradient approach to perform joint inversion of 2D synthetic electromagnetic and seismic data. Their approach exploits the structural similarity that is occasionally seen between the conductivity image and the P-wave velocity image, and enforces this similarity in the form of a constraint on the joint inversion solution. The inversion algorithm updates conductivity and velocity in an alternating fashion while maintaining the structural similarity until the combined CSEM and seismic misfit drops below a predetermined limit.

Chen and Dickens (2007) use a global optimization method (Markov Chain Monte Carlo) to analyze the uncertainties in joint seismic-CSEM inversions, but restrict themselves to 1D synthetic data.

Thus although joint inversion is being investigated as a potential approach for reducing the uncertainty or ambiguity associated with geophysical inversion, there is a need for a more computationally efficient way to perform it. The present invention satisfies this need.

SUMMARY

In one embodiment, the invention is a method for exploring for hydrocarbons, comprising: (a) obtaining 3D data sets of at least two different types of geophysical data, each representing a common subsurface region; (b) using a computer to perform separate 3D inversions of each data type to obtain a 3D model of a corresponding physical property for each data type; (c) using a computer to synthesize a 1D response of each 3D model at one or more selected (x,y) locations to obtain 1D datasets that conform to a 1D expression of the 3D model; and (d) using a computer to jointly invert the 1D datasets at each selected (x,y) location and analyzing results for presence of hydrocarbons. As implied above, practical applications of the invention require that computations be performed on a computer.

BRIEF DESCRIPTION OF THE DRAWINGS

The present invention and its advantages will be better understood by referring to the following detailed description and the attached drawings in which.

The invention will be described in connection with example embodiments. However, to the extent that the following detailed description is specific to a particular embodiment or a particular use of the invention, this is intended to be illustrative only, and is not to be construed as limiting the scope of the invention. On the contrary, it is intended to cover all alternatives, modifications and equivalents that may be included within the scope of the invention, as defined by the appended claims.

DETAILED DESCRIPTION

Figure 1:
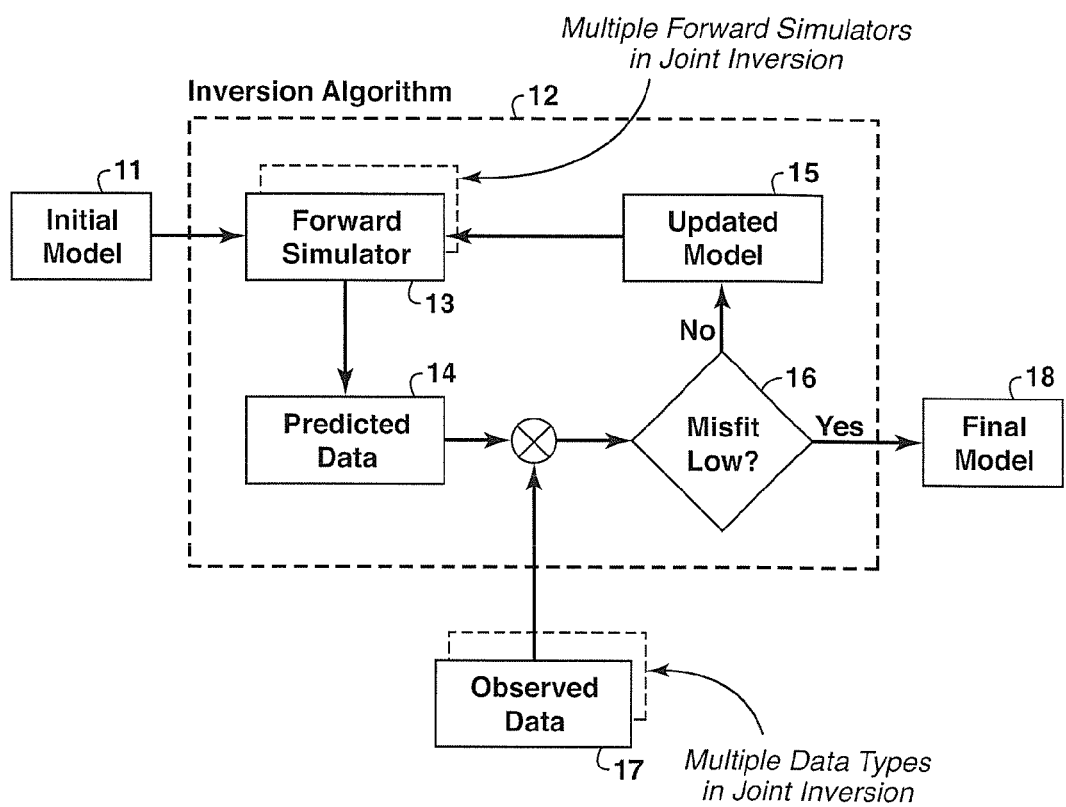
FIG. 1 is a flowchart showing basic steps in joint inversion of one or more data types.

Joint inversion methods such as those described above put severe restrictions on the choice of the inversion algorithm—especially for 3D data, that is for observed data which are sensitive to the three-dimensional variation of geophysical parameters within the earth. One of the biggest computational bottlenecks is the forward simulator (13 in FIG. 1), which is used to predict the data as a function of model parameters. For a real data application, the discretized model that is passed to the forward simulator may represent on the order of 100,000 unknowns, or even more, depending on the complexity of the data. Furthermore, for typical model sizes, a single simulation involving the solution of a 3D wave equation required for predicting seismic data can require several hours or even days on a cluster of multiple CPUs. For an inversion algorithm, such a forward simulation may need to be invoked several hundred times until an acceptable inversion result is obtained. For a joint inversion problem, which involves the use of forward simulators for each of the data types present, this computational bottleneck is an even bigger impediment. Not only is the forward solving more computationally intensive for joint inversion, but the number of times each forward simulator needs to be invoked is also much greater than in the case of single data inversion. This is at least partly due to the increased number of unknowns that are being solved for during the inversion, as well as the increased non-linearity of the inverse problem. For example, joint inversion of CSEM and seismic data involves solving for the resistivity and velocity fields. Consequently, one needs to resort to inversion algorithms that can efficiently solve large-scale joint inversion problems.

Specifically, a class of algorithms known as descent methods or gradient-based methods, which rely on local sensitivity information of the misfit function are usually employed for such purposes. Such methods can robustly handle inverse problems containing several thousand unknowns, but even these methods can be slow to converge to a solution in the case of 3D joint inversion. A drawback of such local methods is that they tend to produce solutions that are only locally optimal in a mathematical sense. That is, there may be other solutions that fit the data much better than the solution produced by gradient-methods. A different class of methods that does not use local sensitivity information is known by the collective name of derivative-free methods (Sen and Stoffa, 1995). These methods tend to produce solutions that are globally optimal and fit the data better than local methods, but at the cost of increased number of calls to the forward simulator. Thus, global methods require many, many more forward simulations than gradient-based methods in order to adequately explore the space of possible solutions. Such large numbers of forward simulations are impractical for 3D problems.

To summarize the above points, the full 3D joint inversion problem can be a computationally challenging problem. Global methods are impractical to apply in a 3D setting, whereas local methods converge to a locally optimal solution—but even then, the convergence may be quite slow because of the problem dimension. Thus, there would be a significant benefit to somehow reduce the dimensionality of the 3D joint inversion problem, which will make the inversion problem computationally tractable. In other words, it would be highly desirable to have a joint inversion method that can exploit global inversion methods in 1D or 2D in a way that is consistent with the three-dimensional complexity of actual geophysical data and models. In a reduced dimension setting, it could even be possible to use derivative-free methods to produce better inversion results. Reducing the dimensionality of the 3D joint inversion problem to make the problem computationally tractable, and allow the use of global optimization methods is the subject of this invention. The invention describes a technique to convert data acquired from the field containing 3D effects to a series of data sets each of which correspond to a 1D model of the underlying physical property.

In one aspect, this invention replaces a computationally intensive and potentially intractable 3D joint inversion problem with a series of 1D joint inversion problems, yet with minimal loss of the 3D information present in the acquired geophysical data. In the present inventive method, significant 3D effects will be accounted for when the 3D data set is replaced by a series of 1D data gathers. Data acquired from the field will always have three-dimensional effects present. However, the present disclosure shows that it is possible to pre-process the data in order to remove these 3D effects and essentially construct a series of data sets that correspond to a 1D expression of the original 3D model.

Reducing Dimensionality

By removing 3D effects from data acquired in the field, the present invention formulates a joint inversion problem in which the unknown parameters are a 1D property model. Accordingly, this joint inversion problem will henceforth be termed a 1D joint inversion. A series of 1D joint inversion problems can be defined in the original 3D space, but each 1D problem will contain significantly fewer unknowns than if the problem were formulated in a 3D sense. Thus, in effect, the invention decouples the original 3D model and creates a situation in which the 3D model can be treated as a series of 1D models in depth at various spatial locations.

Figure 2:
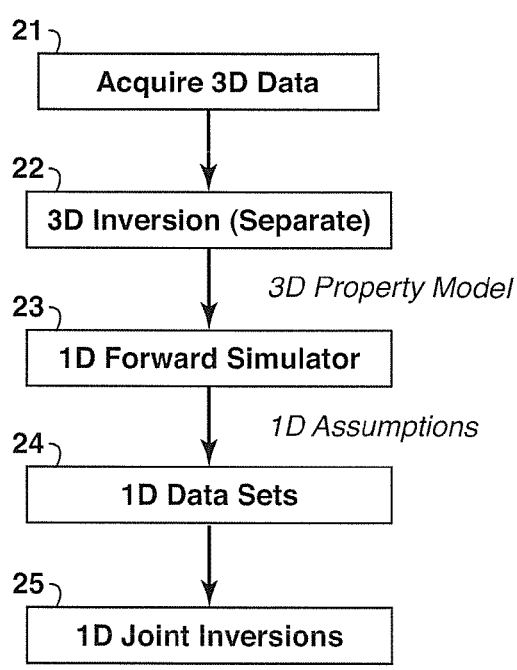
FIG. 2 is a flowchart showing basic steps in one embodiment of the present inventive method.

The invention described here can be applied to any geophysical data, such as CSEM, seismic, or gravity data. However, in some cases, standard processing methods may be available (and in fact preferable) to achieve the same effect, such as migration in the case of seismic data, as described later below. The method presented here can, however, be used for geophysical data other than seismic, for which no standard process equivalent to seismic migration exists. FIG. 2 is a flow chart outlining basic steps in one embodiment of the present inventive method.

In step 21, multiple types of geophysical data are acquired over a common physical region of the earth.

In step 22, the physical property of interest is extracted from the data using a 3D inversion for each data type alone. That is, perform a 3D inversion separately for each data type in the joint inversion problem to obtain the corresponding 3D property model. For example, a CSEM inversion to produce a 3D conductivity model, a gravity inversion to produce a density model, and so on. The terms "physical property" and "earth property" are used interchangeably herein and may include, without limitation, velocity, density, conductivity, resistivity, magnetic permeability, porosity, lithology, fluid content and permeability.

In step 23, the 3D property models constructed in step 22, are used to extract 1D property models and construct 1D synthetic data 24 at various spatial locations using a 1D forward simulator. The 1D synthetic data sets are one-dimensional in the sense that they are calculations of what the data recorded at the receivers in step 21 would have been had the earth properties corresponded to a one-dimensional model, varying only with z and not with x or y.

At step 25, the various 1D "data" generated in step 23 are jointly inverted.

Steps 22, 23, and 25 would all be performed on a computer in practical applications of the inventive method.

Figure 3:
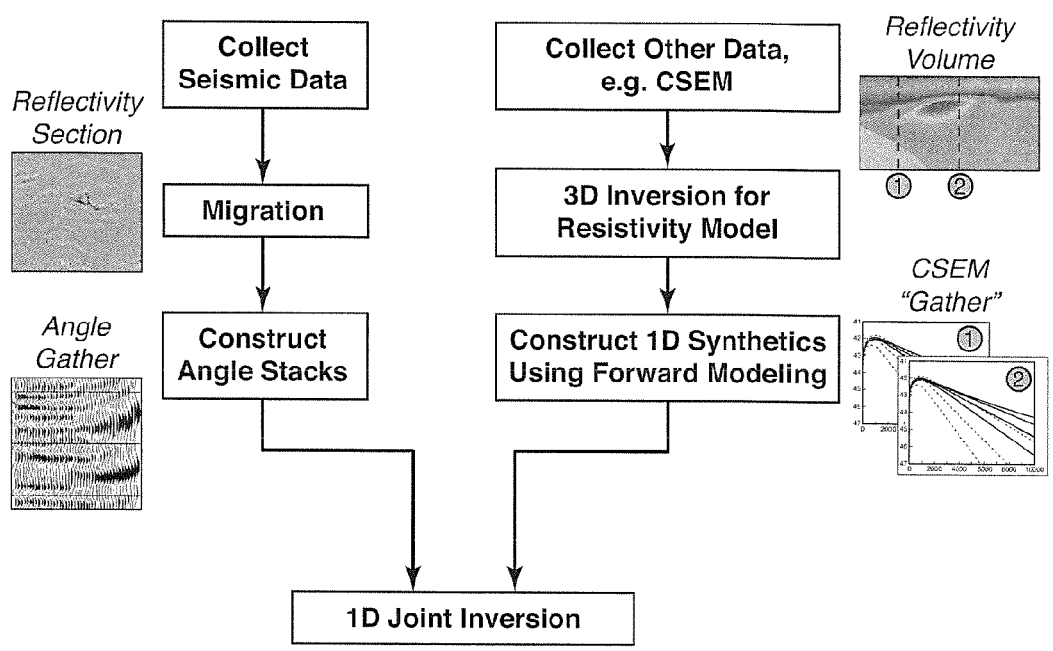
FIG. 3 is a schematic diagram illustrating applying the present inventive method to electromagnetic and seismic data.

FIG. 2 shows basic steps in one embodiment of the inventive method that may be applied to each of the data types in the joint inversion, while FIG. 3 shows those steps being applied to CSEM data in a joint inversion of CSEM and seismic data.

The process flow on the left in FIG. 3 may be recognized as that of seismic data migration, the result of which are seismic gathers, which are amenable to a 1D inversion for hydrocarbon identification. The use of seismic migration as an approximate form of non-iterative inversion is well known (Bleistein, 1987), because a velocity model must be assumed in order to perform the migration. Also well-known is the application of 1D inversion techniques to the output of seismic migration. Examples include amplitude-versus-offset or AVO inversion applied to the common-reflection-point gathers and impedance inversion applied to stacked images (Stolt and Weglein, 1985). Alternatively, the full waveform seismic trace data can be inverted directly for elastic properties, such as velocities, impedances, and densities (step 22 of FIG. 2). These 3D property grids can then be used to synthesize a number of 1D data sets 24 using a 1D synthetic forward simulator (step 23). In other words, the method of FIG. 2 may be applied literally to seismic data, or may be applied equivalently in the form of seismic migration as shown in FIG. 3.

On the right of FIG. 3 is the process flow for CSEM data, for which no standard methods exist to construct a series of 1D "gathers". However, the CSEM equivalent is accomplished by applying the enumerated steps of the invention from FIG. 2:

Step 21: Acquire CSEM data from the field, which will contain the full 3D effect of the subsurface resistivity structure. Such data are called "3D data" herein, and result from surveys in which the source and receiver pairs essentially form a 2D grid over the region of interest, and the source signal propagates through the earth in a 3D sense on its way to the receiver. However, it is noted that no matter how a survey is conducted, it is inevitable that there will be 3D effects in the data collected.

Step 22: Using a full 3D simulator, perform a 3D inversion of the data obtained in Step 1 to obtain a 3D resistivity model of the earth (See Newman and Alumbaugh, 1997). Note that this is not a joint inversion because the inversion is for a single subsurface property using a single geophysical data set, which although still a computationally expensive problem, is tractable and done routinely in the oil industry using large compute clusters. The result of this 3D inversion will be a 3D volume of resistivity in space (i.e., X,Y,Z coordinates).

For one or more (X,Y) locations in the 3D space, extract a 1D resistivity model in depth (Z) from the 3D volume inverted in step 22. This is straightforward. Use a 1D forward simulator 23 to construct a 1D synthetic CSEM data set 24 using the extracted resistivity model from each of these locations. The 1D synthetic data sets so formed will conform to the 1D expression of the three dimensional resistivity model obtained in step 22. The 1D data sets will most typically be the amplitude and phase of electric and magnetic fields as functions of source-receiver offset at selected frequencies. The selected frequencies could differ from the frequencies input to the 3D inversion in step 22. More generally, the synthesized data could be time-domain data. The 3D inversion in step 22 may also operate on either frequency- or time-domain data.

The preceding steps 21-24 are then repeated for any other data types besides seismic and CSEM to be used in the joint inversion to obtain 1D expressions of the corresponding 3D models. Examples include gravity, tensor gravity, magnetotelluric, and aeromagnetic data sets. Thus, each geophysical data set acquired in the field (step 21) is in effect transformed into a series of 1D synthetic datasets 24 corresponding to the (X,Y) locations selected for the 1D physical property models extracted at the end of step 22. These 1D data sets can now be jointly inverted to produce a result that simultaneously explains all data types. Note that some of the synthesized data sets may depend on source-receiver offset while others do not. This 1D joint inversion will need to be performed at each selected (X,Y) location. The same 1D forward simulator that was used in constructing the synthetic 1D data for each data type should preferably be used during the joint inversion. The result of the 1D joint inversions will be a series of property models (conductivity, velocity, density, etc.), one for each spatial location, which will explain all the geophysical data that were part of the joint inversion. These 1D models may then be interpreted individually or as a group for the possible presence of hydrocarbons.

The computational cost savings can be significant in this process. Each 1D joint inversion problem contains almost an order of magnitude fewer unknowns than the corresponding 3D joint inversion problem. For example, a 3D volume with a 1000×1000×1000 grid translates into an inversion problem with $10^9$ unknowns. A nonlinear problem of this size cannot be robustly solved, especially with the added complexity of this problem containing multiple, physically disparate, datasets. On the other hand, solving thousands of 1D joint inversion problems, each containing about a 1000 unknowns is a much more computationally tractable and numerically appealing problem. In this case, most of the computational resources will be spent during step 22 of the process, which involves performing separate inversions for each data type, and has already been shown to be a tractable problem.

In a preferred embodiment of this invention, a joint inverse problem may be set up involving one high frequency data source (e.g., active seismic), and at least one other low frequency data source (CSEM, gravity, magnetotelluric, etc). The acquisition processes for active seismic, CSEM, and gravity data are well known within the oil and gas industry.

The three-step process described above (steps 21 to 23 in FIG. 2) can be repeated for all data types, including seismic data. In the seismic case, one could employ a full wave inversion (FWI) workflow to produce a 3D velocity model, in step 22 of the invention. The 3D velocity model can then be split into a series of 1D models, which when passed through a 1D forward simulator will produce a series of data sets that conform to the 1D expression of the original 3D model.

Another embodiment of the invention could relate to how the final 1D joint inversion problems are formulated. In one case, if joint inversion of CSEM and seismic data is to be performed, then the joint inversion could be set up so that the unknown model parameters are conductivity and seismic wave velocity, and a constraint applied that allows only certain combinations of these two properties in the final solution to the inverse problem. Note that this embodiment does not directly involve rock physics relations, which indirectly couple conductivity and velocity or density.

Seismic data can be processed to remove surface topography, geometric spreading effects, ghosting, amplitude effects, noise, multiples, etc. using well known processing techniques, and then migrated (see for example Seismic Data Processing Theory and Practice by Hatton et al., Blackwell Scientific Publications (1986) for general background on this topic not directly related to the present invention. Seismic migration (Stolt and Weglein, 1985) repositions the seismic data so that energy that has been dispersed by subsurface diffractors is collapsed back onto the physical location of the diffractors (i.e., subsurface reflectors). This allows the seismic data to provide a structural picture of the subsurface that can be readily interpreted. The seismic traces correspond to a physical location in space that can be plotted on a map of the surface of the earth. Each trace interrogates the subsurface beneath the map location. Consequently, migrated seismic data represent a series of 1D seismic traces or trace gathers that have been pre-processed such that diffractors and other 3D wave-propagation effects have been corrected leaving the user with what is effectively a 1D seismic dataset, i.e. a dataset based on an underlying 1D model of the earth.

For seismic data, the technique of migrating data to produce a reflection image of the subsurface that approximately accounts for 3D effects and then carrying out 1D inversions on the post-migration data to infer what magnitude of changes in velocity and density gave rise to those reflections is well known (see, for example, Stolt and Weglein, 1985) and might naturally be applied to seismic data destined for joint inversion. The present invention is a method of preparing 1D data sets in a somewhat, but non-obviously, analogous manner for geophysical data other than seismic data, although the FIG. 2 steps can be used as well on seismic data. This is advantageous for jointly inverting two or more data sets of different data types, because the joint inversion can be one-dimensional. Thus, the present invention applies 3D inversion followed by 1D forward synthesis to at least non-seismic data, before presenting 1D data sets to joint inversion.

How to perform joint inversion is not the subject of this invention. There are many publications on this subject which will be known to the persons who work in this field. Therefore only a brief summary will be given here of the main issues that arise in performing joint inversion of two or more data types, and that summary follows next.

Model Parameterization

The disparate data types need somehow to be linked in order for the inversion to be performed jointly. The preferred mode for doing this is to define a rock physics model to relate the physical properties (velocity, density, conductivity) that can be inferred from the different data to the earth properties of interest (e.g., porosity, lithology, and fluid content). This is well-known in the literature; see for example Xu and White (1995).

Misfit Function Definition

The data misfit function, sometimes called cost function or objective function, for each data type can be defined as a function of the rock properties, and the total misfit function for the joint inverse problem can be defined as a weighted linear combination of the individual misfit functions. The weights may not be known a priori, but a data weighting strategy could be devised by looking at the noise statistics of the data collected in the field. Such an additive weighting function is not only numerically appealing because of its simplicity, but it also helps in terms of software architecture, as it helps maintain the de-coupling between the individual forward simulator codes.

Inversion Algorithm

Since the joint inversion problems being solved are in 1D, it is possible to apply both local as well as global optimization techniques to solve the inversion. Global techniques may be able to handle inversion problems containing a few hundred unknown model parameters, which is certainly within the realm of 1D geophysical inversion problems. Local techniques can also be applied, the only requirement being that the forward simulator used must also supply local sensitivity information for the optimizer to suggest a model update. The choice of the method is problem dependent, but the fact that the inversion problem is in 1D does not completely eliminate an entire class of inversion techniques.

Parallelization

After the 1D simulations 23 of typically many 1D data sets 24 (see FIG. 2's flowchart), many 1D joint inversion problems need to be solved in step 25, one for each selected spatial (X,Y) location over the geophysical survey area. These calculations can be treated as completely independent (that is, they do not share any information between them) and run in parallel on a separate processor on a computer cluster, and the results of each inversion are subsequently collected together for interpretation. Alternatively, chunks of the spatial locations can be run in parallel, thereby allowing some sharing of information from one geographical location to another (e.g., so as to allow lateral smoothing from one location to the next). A computer program can be written to automate the management of the individual inversion tasks. The main processor creates individual inversion tasks and sends them out to the sub-processors. An individual task works on one spatial location (or chunk of locations) over the geophysical survey area, and can have access to the 3D property model of each data type from step 22 of the invention. Each processor then forward simulates the synthetic 1D data for each data type, performs the joint inversion, and returns the result to the main processor for output.

As an example of a parallel implementation, one might write a computer program that takes the output of step 22 (a 3D property model), and then for each selected (X,Y) location, produces the different types of synthetic data (seismic, CSEM, gravity etc.) and stores the data to disk. A different computer program then simply reads the data off the disk and launches the 1D joint inversions on a cluster of processors.

The foregoing patent application is directed to particular embodiments of the present invention for the purpose of illustrating it. It will be apparent, however, to one skilled in the art, that many modifications and variations to the embodiments described herein are possible. All such modifications and variations are intended to be within the scope of the present invention, as defined in the appended claims. Persons skilled in the art will readily recognize that in practical applications of the invention, at least some of the steps in the present inventive method are performed on or with the aid of a computer, i.e. the invention is computer implemented.

REFERENCES

Bleistein, N., 1987, "On the imaging of reflectors in the earth", Geophysics, 52, No. 7, pp. 931-942.
Chen, J., and T. Dickens, 2007, "Effects of uncertainty in rock-physics models on reservoir parameter estimation using marine seismic AVA and CSEM data", abstracts of the 77th Annual International Meeting, Society of Exploration Geophysicists, pp. 457-461.
Hatton, L., M. H. Worthington, and J. Makin, Seismic Data Processing Theory and Practice, Blackwell Scientific Publications, 1986.
Hoversten et al., 2006, "Direct Reservoir Parameter Estimation Using Joint Inversion", *Geophysics.*, 71, No. 12, pp. C1-C13.
Hu, W., Abubakar, A., and Habashy, T. M., 2009, "Joint Electromagentic and Seismic Inversion using Structural Constraints", *Geophysics*, 74, No. 6, pp. R99-R109.
Stolt, R. H., and A. B. Weglein, 1985, "Migration and inversion of seismic data", *Geophysics*, 50, No. 12, pp. 2458-2472.
Newman, G. A. and Alumbaugh, D. L., 1997, "Three-dimensional Massively Parallel Electromagnetic Inversion—I. Theory", *Geophys. J. Int.* 128, pp. 345-354.
Parker, R. L., 1994, "Geophysical Inverse Theory", Princeton University Press, NJ.
Sen, M. K. and Stoffa, P. L., 1995, "Global Optimization Methods in Geophysical Inversion", Elsevier.
Xu, S. and White, R. E., 1995, A new velocity model for clay-sand mixtures, *Geophysical Processing*, 43, 91-118.

What is claimed is:

1. A method for exploring for hydrocarbons, comprising:
obtaining 3D data sets of at least two different types of geophysical data, each representing a common subsurface region;
using a computer to perform separate 3D inversions of each data type to obtain a 3D model each of a corresponding physical property for each data type;
using a computer to synthesize a 1D response of each 3D model at one or more selected (x,y) locations to obtain 1D datasets that each conform to a 1D expression of a different 3D model of one of the at least two different types of geophysical data; and
using a computer to jointly invert the 1D datasets, each of which was synthesized from different 3D models, which correspond to the at least two different types of geophysical data, respectively, at each selected (x,y) location and analyzing results for presence of hydrocarbons.

2. The method of claim 1, wherein the joint inversion of the 1D datasets is accomplished using a gradient-based or a derivative-free method.

3. The method of claim 1, wherein calculations in the jointly inverting the 1D datasets are parallelized by sending data from different geographical sub-regions to different processors.

4. The method of claim 1, wherein the at least two different types of geophysical data are chosen from a group consisting of active-source seismic, passive-source seismic, controlled-source electromagnetic, magnetotelluric, gravity, tensor gravity, and magnetic data.

5. The method of claim 4, wherein the results of jointly inverting the 1D data sets include models in at least 1D of the corresponding physical property for each data type.

6. The method of claim 4, wherein the corresponding physical property for each data type comprise at least two of a group consisting of: velocity, density, conductivity, resistivity, magnetic permeability, porosity, lithology, fluid content and permeability.

7. A computer program product, comprising a non-transitory computer usable medium having a computer readable program code embodied therein, said computer readable program code adapted to be executed to implement a method for exploring for hydrocarbons, said method comprising:
reading into computer memory or data storage 3D data sets of at least two different types of geophysical data, each representing a common subsurface region;
performing separate 3D inversions of each data type to obtain a 3D property model for each data type;
synthesizing a 1D response of each 3D property model at one or more selected (x,y) locations to obtain 1D datasets that each conform to a 1D expression of a different 3D property model of one of the at least two different types of geophysical data; and
jointly inverting the 1D datasets, each of which was synthesized from different 3D models, which correspond to the at least two different types of geophysical data, respectively, at each selected (x,y) location and displaying or downloading results.

8. A method for producing hydrocarbons from a subsurface region, comprising:
conducting at least two types of geophysical survey on the subsurface region;
using a method of claim 1 to jointly invert data from the at least two types of geophysical survey, obtaining at least one model of a physical property of the subsurface region;

using the at least one model to assess hydrocarbon potential of the subsurface region; and drilling a well into the subsurface region based at least in part on the assessment of hydrocarbon potential.

* * * * *